United States Patent [19]
Nakamura

[11] Patent Number: 5,495,099
[45] Date of Patent: Feb. 27, 1996

[54] HIGH SPEED SUPER PUSH-PULL LOGIC (SPL) CIRCUIT USING BIPOLAR TECHNOLOGY

[75] Inventor: Satoshi Nakamura, Tokyo, Japan

[73] Assignee: NEC Corporation, Tokyo, Japan

[21] Appl. No.: 202,826

[22] Filed: Feb. 28, 1994

[30] Foreign Application Priority Data

Mar. 2, 1993  [JP]  Japan ................................. 5-040796

[51] Int. Cl.[6] .................................................. H03K 19/20
[52] U.S. Cl. ........................... 326/129; 326/124; 327/374
[58] Field of Search ................................. 307/454, 456, 307/446, 246; 326/124, 128, 129; 327/374

[56] References Cited

U.S. PATENT DOCUMENTS

| | | | |
|---|---|---|---|
| 4,508,979 | 4/1985 | Togari | 307/513 |
| 4,737,665 | 4/1988 | Ovens | 307/456 |
| 5,089,724 | 2/1992 | Chuang et al. | 307/454 |
| 5,206,546 | 4/1993 | Usami | 307/446 |
| 5,237,214 | 8/1993 | Usami | 307/454 |
| 5,298,802 | 3/1994 | Usami et al. | 307/446 |
| 5,334,886 | 8/1994 | Chuang | 307/455 |

FOREIGN PATENT DOCUMENTS

| | | |
|---|---|---|
| 0050033 | 12/1981 | European Pat. Off. . |
| 0191165 | 12/1985 | European Pat. Off. . |
| 0317890 | 11/1988 | European Pat. Off. . |
| 61-057121 | 3/1986 | Japan . |
| 4100315 | 8/1990 | Japan . |
| 364123A | 3/1991 | Japan . |
| 3267817A | 11/1991 | Japan . |

Primary Examiner—Edward P. Westin
Assistant Examiner—Stephen Calogero
Attorney, Agent, or Firm—Whitham, Curtis, Whitham & McGinn

[57] ABSTRACT

A PNP bipolar transistor is connected to both ends of a resistive element of a Super Push-Pull Logic (SPL) circuit so as to place an emitter thereof at the side of a power supply source. Resistive elements and an NPN bipolar transistor forms a bias circuit for biasing a low voltage to a base of the PNP bipolar transistor. The base of the PNP bipolar transistor is connected to an emitter node of a NPN bipolar transistor through a capacitive load element. By this construction, the present invention can provide signal without any delay to turn on the PNP bipolar transistor. Therefore, the collector response speed of the SPL circuit can be increased.

11 Claims, 4 Drawing Sheets

HIGH SPEED SUPER PUSH-PULL LOGIC (SPL) CIRCUIT USING BIPOLAR TECHNOLOGY

BACKGROUND OF THE INVENTION

1. Field of the Invention

The present invention relates to a logic circuit and semiconductor integrated circuit device, and more particularly to technology effective for use in a Non Threshold Logic (NTL) circuit, a Super Push-pull Logic (SPL) circuit and further high-speed logical integrated circuits using these logic circuits as a basic circuit, for example.

2. Description of the Prior Art

The NTL circuit is proposed as a high-speed and low electric power consuming digital logical circuit. For example, a SPL circuit and the like in which an Active Pull-Down (APD) circuit is provided in said NTL circuit are disclosed in Japanese Unexamined Provisional Publication, No. 3-64123 (prior art 1). Further, in order to enhance the collector response of the SPL circuit, a SPL-B circuit is also proposed in Japanese Unexamined Provisional Publication, No. 3-267817 (prior art 2).

FIG. 1 is a circuit diagram showing one example of the conventional SPL circuit (prior art 1). As shown in FIG. 1, the conventional SPL circuit has a phase splitting circuit comprising a bipolar transistor Q21 and resistive elements R21 and R23 which are connected in series between a positive power supply terminal 1 and a negative power supply terminal 2. An input signal VIN is input into a base of the transistor Q21. In between the positive power supply terminal 1 and the negative power supply terminal 2, a bipolar transistor Q23 and a resistive element R24 are connected in series, and a negative power supply terminal 3 is connected to a base of the transistor Q23. A capacitor C22 is connected between a node A2 connecting the transistor Q21 and the resistive element R23 and a node A3 connecting the transistor Q23 and the resistive element R24. Further, a bipolar transistor Q22 and a bipolar transistor Q24 are connected in series between the positive power supply terminal 1 and the negative power supply terminal 2, a base of the transistor Q22 is connected to a node A1 and a base of the transistor Q24 is connected to the node A3. Both an emitter of the transistor Q22 and a collector of the transistor Q24 are connected to an output terminal VOUT.

There exists a stray capacitance CC3 between the collector node (Node A1) of this phase splitting circuit and the negative power supply terminal 2. In this case, when the level of an input signal VIN is high, the transistor Q21 is turned on so that the stray capacitance CC3 in the collector node (Node A1) is quickly discharged through the transistor Q21.

When the level of the input signal VIN is low, however, the stray capacitance CC3 of the collector node (Node A1) is passively charged through the resistive element R21 because the transistor Q21 is at the off-state. Therefore, the raising of the potential at the collector node (Node A1) becomes slow according to the time constant determined by the product of a value of the resistive element R21 and the stray capacitance CC3, and there was a problem therefore that the propagation delay time responding to the low level change of the input signal VIN becomes longer.

As one of the approaches to overcome such a problem, the SPL-B circuit is proposed. FIG. 2 is a circuit diagram showing the constitution of the SPL-B circuit (prior art 2).

In FIG. 2, the same numeral is used for the elements or parts which have the same function as those shown in FIG. 1 and a detailed explanation will be omitted. As shown in FIG. 2, the conventional SPL-B circuit is a circuit in which a P-channel MOSFET Q5 is connected in parallel with a resistive element R21 in a phase splitting circuit area comprising a transistor Q21 and resistive elements R21 and R23 in the SPL circuit. To a gate of this MOSFET Q5, the input terminal VIN is connected.

In this SPL-B circuit, the stray capacitance CC2 of the collector node (node A1) is actively and quickly charged through the P-channel MOS transistor Q5 because the transistor Q5 is turned on when the level of the input signal VIN is low. On the other hand, when the level of the input signal VIN is high, the P-channel MOSFET Q5 is in an off-state and therefore does not prevent a quick discharge of the collector node (node A1) through the transistor Q21 in the phase splitting circuit area.

This improved SPL-B circuit was aimed to charge the collector node at high-speed. The MOS transistor, however, generally has a low ability of the current drive. Furthermore, there was another problem in the SPL-B circuit that the assembly process obviously becomes comprehensive because the assembly process for the MOS transistor is needed in addition to the assembly process for a bipolar transistor since the MOS transistor must be combined into the SPL circuit comprising the bipolar transistor.

Another problem in this circuit is that the input capacity against the input signal is increased by the input capacity of the P-channel MOSFET Q5 so that the propagation delay time becomes longer because switching of the P-channel MOSEFT Q5 is made by the input signal VIN.

SUMMARY OF THE INVENTION

It is therefore an object of the present invention to provide a semiconductor integrated circuit capable of making a collector response of a SPL circuit at high-speed without using the MOS transistor having a lower driving capacity and requiring a more complicated fabrication process.

According to the present invention, there is provided a semiconductor integrated circuit comprising: a signal input terminal; an NPN bipolar transistor, a base of which being connected to said signal input terminal; a power supply terminal; a resistive element, one end of which being is connected to a collector of said NPN bipolar transistor and another end thereof being connected to said power supply terminal; and a PNP bipolar transistor, a collector of which being is connected to a collector of said NPN transistor and an emitter of said PNP bipolar transistor being connected to said power supply terminal.

According to the present invention, a signal to turn on said PNP bipolar transistor can be led through a capacitative load element etc., it is taken from an emitter node not directly related with the logical signal transmission, therefore the input capacity at the input side of the circuit is not increased and the propagation delay time does not become longer.

In addition, the semiconductor integrated circuit according to the present invention can be assembled by less steps than the conventional circuit (the SPL-B circuit) using the P-channel MOSFET because all constituent elements can be constructed with bipolar transistors in the present invention.

Further, regarding the relationship between the wiring capacity and the gate delay time, the semiconductor integrated circuit according to the present invention can be increased in speed by 84% compared to the conventional semiconductor integrated circuit, for example when the wiring has the capacity value of 0.4 pF.

DETAILED DESCRIPTION OF THE PREFERRED EMBODIMENTS

Figure 1:
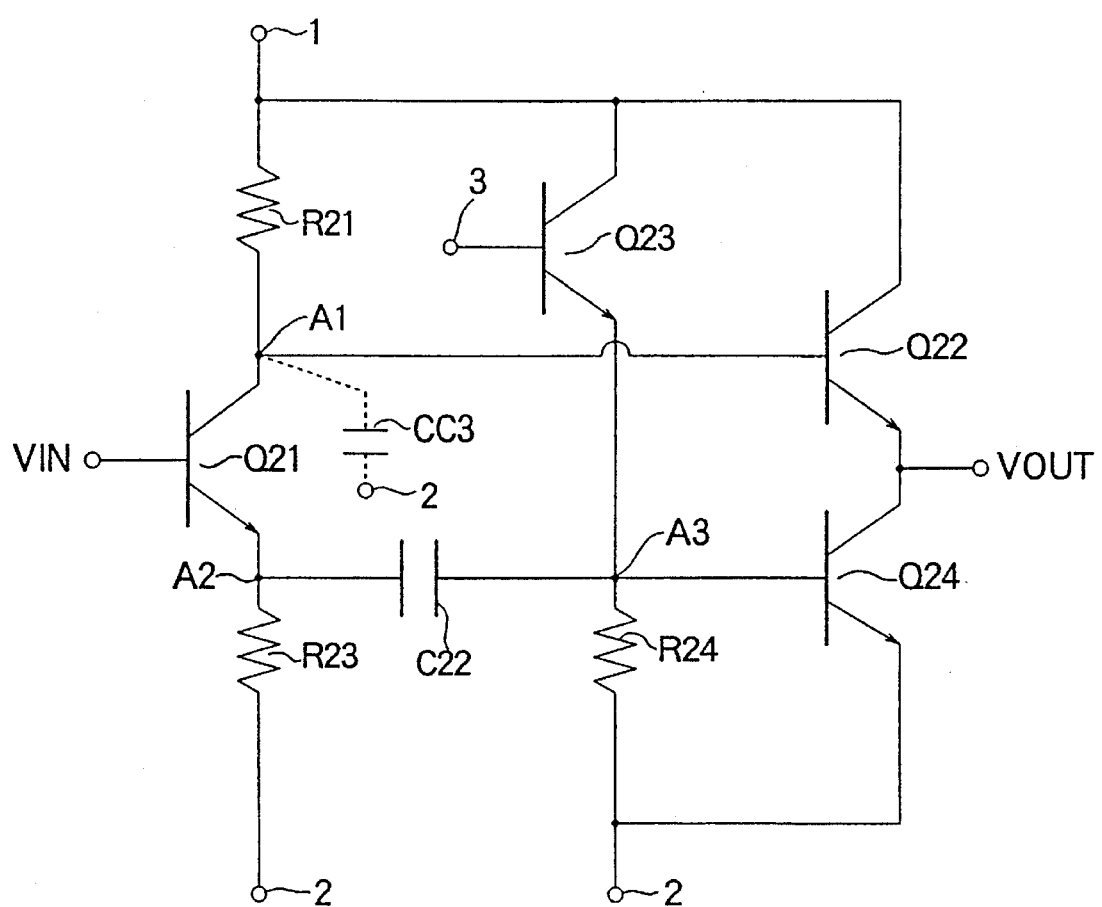
FIG. 1 is a circuit diagram showing a first conventional semiconductor integrated circuit.
Figure 2:
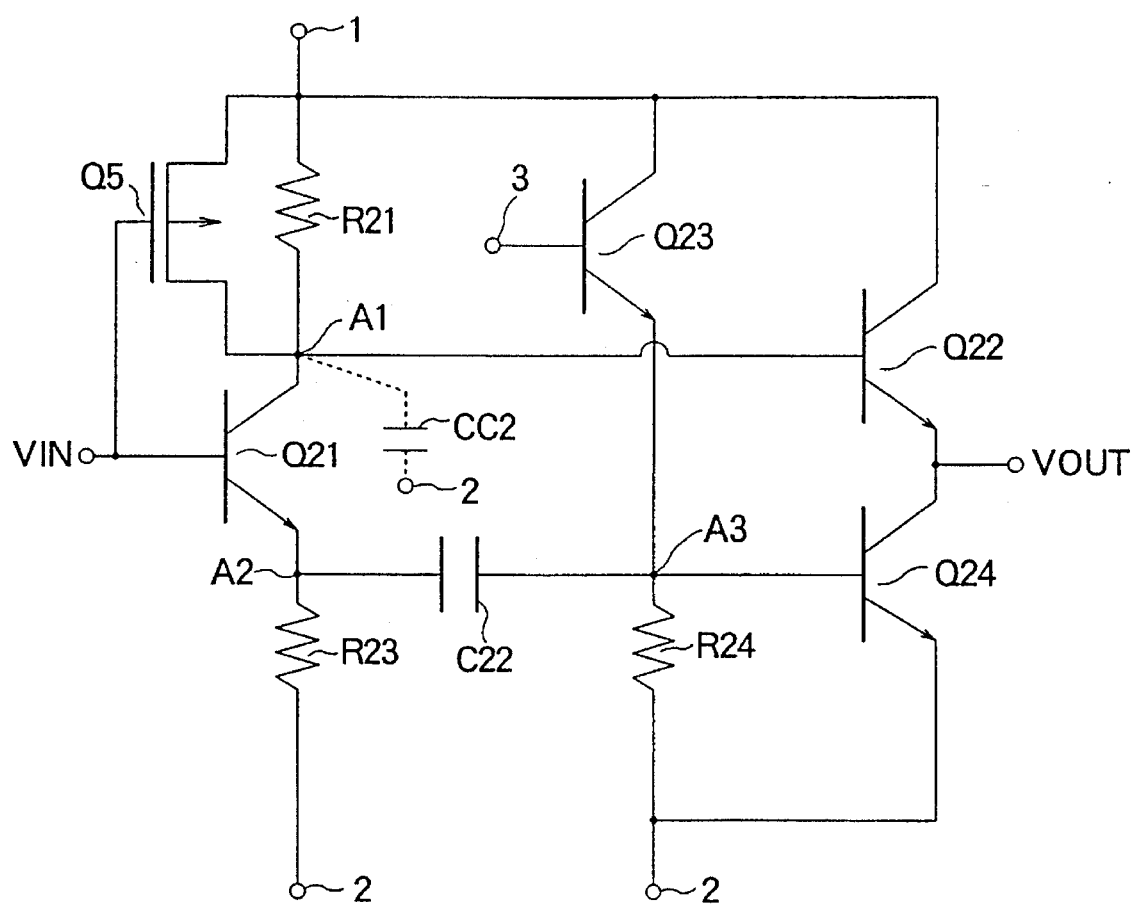
FIG. 2 is a circuit diagram showing another conventional semiconductor integrated circuit.
Figure 3:
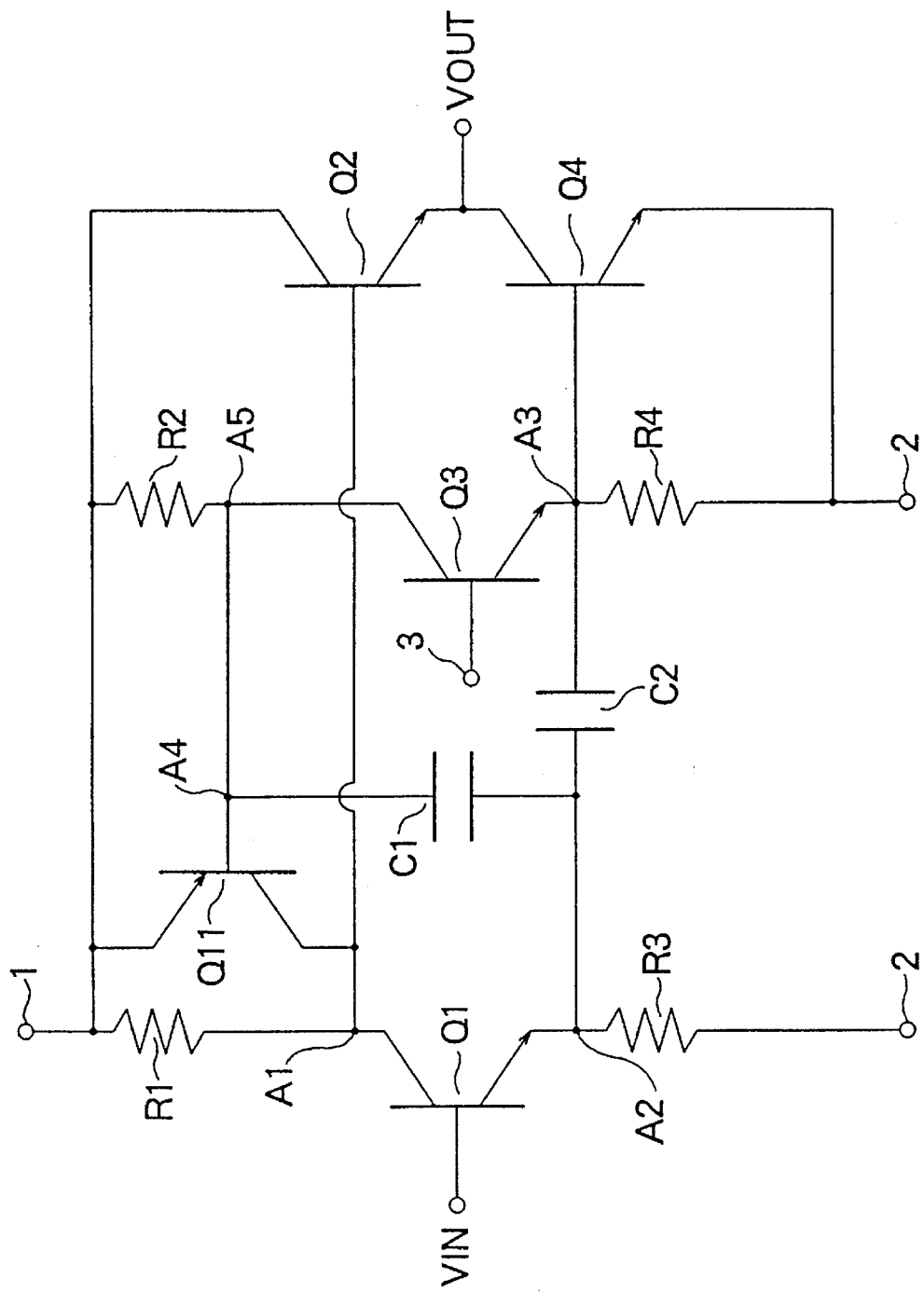
FIG. 3 is a circuit diagram showing a semiconductor integrated circuit according to an embodiment of the present invention.

The present invention will now be described more fully hereinafter with reference to FIG. 3, in which a preferred embodiment of the present invention is shown. This embodiment relates to a semiconductor integrated circuit comprising a NTL circuit including a PNP transistor. In this semiconductor integrated circuit, a base of a first NPN bipolar transistor Q1 is connected to a signal input terminal VIN. A collector of the first NPN transistor Q1 is connected to one end of a first resistive element R1. To the node A1 between the transistor Q1 and the resistive element R1, a collector of a first PNP transistor Q11 and a base of a second NPN transistor Q2 are connected.

Another end of the first resistive element R1, an emitter of the first PNP transistor Q11, one end of a second resistive element R2 and a collector of the second NPN transistor Q2 are connected to a positive power supply terminal 1. To another end of the second resistive element R2, a base of the first PNP transistor Q11 and a collector of a third NPN transistor Q3 are connected. To an emitter of the first NPN transistor Q1, one end of a third resistive element R3 is connected through a node A2. Another end of the third resistive element R3 is connected to a first negative power supply terminal 2, and one end of a fourth resistive element R4 and a base of a fourth NPN transistor Q4 are connected to an emitter of the third NPN transistor through a node A3.

An emitter of the second NPN transistor Q2 and a collector of said fourth NPN transistor Q4 are connected to a signal output terminal VOUT. Another end of the fourth resistive element R4 and an emitter of the fourth NPN transistor Q4 are connected to the first negative power supply terminal 2. A second negative power terminal 3 is connected to a base of the third NPN transistor Q3. Further, a capacitative load element C1 is connected between a base of the first PNP transistor Q11 and the emitter of the first NPN transistor Q1, and a capacitative load element C2 is connected between the emitter of the first NPN transistor Q1 and the base of the fourth NPN transistor Q4.

Then, the operation of the semiconductor integrated circuit thus constructed according to the present embodiment will be explained. When a low level signal is input to the signal input terminal VIN, the NPN transistor Q1 is turned off. At this moment, the potential at the emitter node (Node A2) of the transistor Q1 decreases and therefore the potential at the base node (Node A4) of the PNP transistor Q11 also decreases temporally through the capacitative load element C1. Therefore, the transistor Q11 is turned on and the collector node (Node A1) of the NPN transistor Q1 is actively and quickly charged by a large collector current flowing into the PNP bipolar transistor Q11 having a high current diving ability.

When said collector node (Node A1) is charged up to the potential of positive power supply terminal 1, the potential between the emitter and the collector of the PNP bipolar transistor Q11 falls down to 0 volt and then the PNP bipolar transistor Q11 is turned off.

Figure 4:
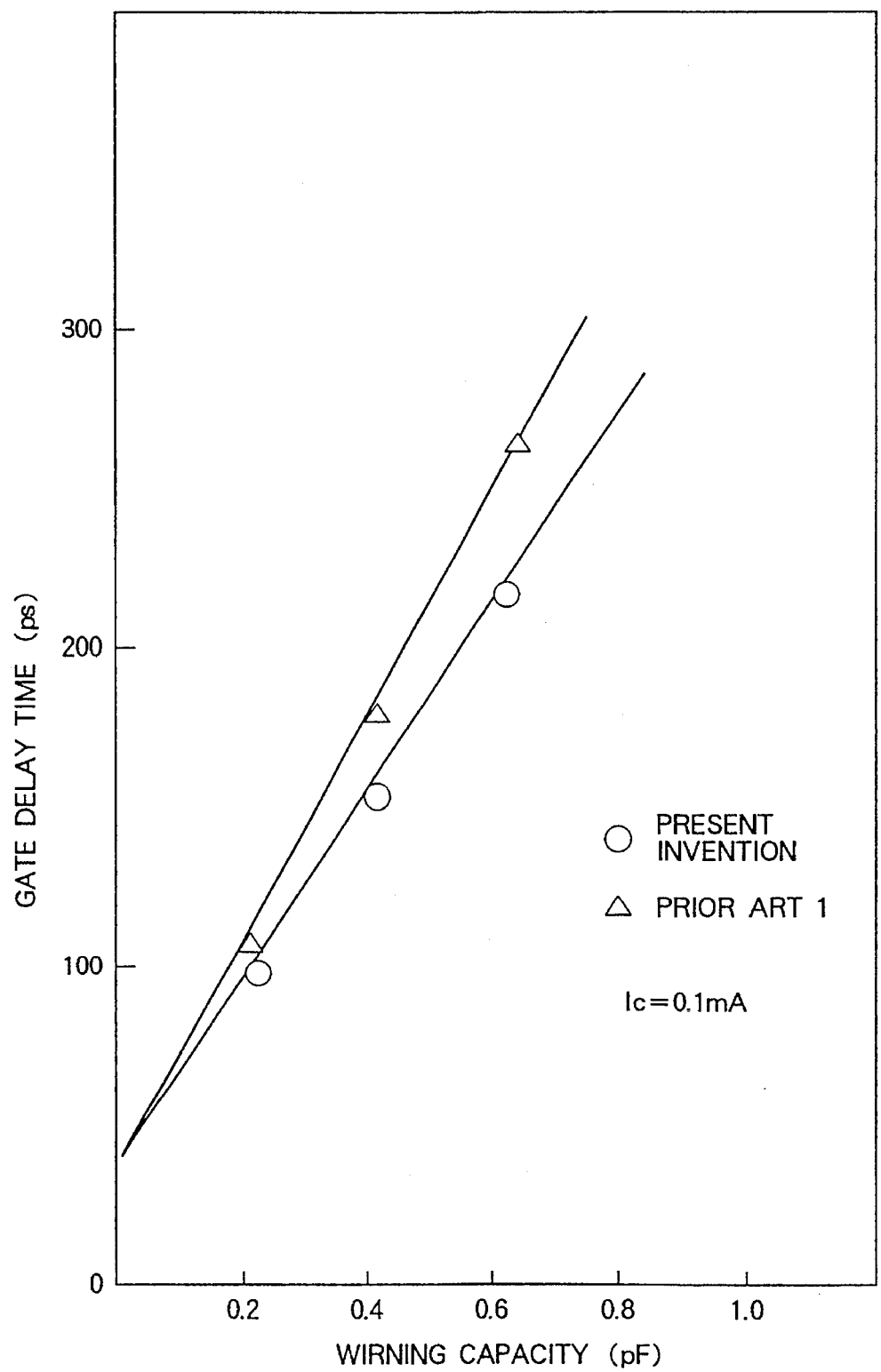
FIG. 4 is a graph showing the relationship between the wiring capacity and the gate delay time.

FIG. 4 is a graph prepared by plotting the wiring capacity on the X-axis and the gate delay time on the Y-axis to show the relationship between the wiring capacity and the gate delay time. FIG. 4 clearly indicates that the semiconductor integrated circuit according to the present invention has a shorter gate delay time than the first conventional semiconductor integrated circuit. For example, when the wiring capacity has the value of 0.4 pF, the present invention can increase the speed by 84% compared to the conventional semiconductor integrated circuit.

What is claimed is:

1. A semiconductor integrated circuit comprising:

a signal input terminal;

a signal output terminal;

an NPN bipolar transistor including a base connected to said signal input terminal and an emitter, said NPN bipolar transistor being coupled to said signal output terminal;

first and second power supply terminals;

a resistive element having a first end connected to a collector of said NPN bipolar transistor, and a second end connected to said first power supply terminal, said emitter of said NPN bipolar transistor being coupled to said second power supply terminal;

a PNP bipolar transistor having a collector connected to a collector of said NPN bipolar transistor, an emitter connected to said first power supply terminal, and a base connected at a node where a signal phase is the same phase as a signal applied to the signal input terminal; and a capacitative load element connected between said base of said PNP bipolar transistor and said emitter of said NPN bipolar transistor.

2. A semiconductor integrated circuit comprising:

a signal input terminal;

a signal output terminal;

an NPN bipolar transistor including a base connected to said signal input terminal, said NPN bipolar transistor being coupled to said signal output terminal;

first and second power supply terminals;

a resistive element having a first end connected to a collector of said NPN bipolar transistor, and a second end connected to said first power supply terminal, an emitter of said NPN bipolar transistor being coupled to said second power supply terminal; and a PNP bipolar transistor having a collector connected to a collector of said NPN bipolar transistor, and an emitter connected to said first power supply terminal; and a capacitative load element connected between a base of said PNP bipolar transistor and said emitter of said NPN bipolar transistor, said capacitative load element comprising a bias circuit for biasing a low voltage to said base of said PNP bipolar transistor.

3. A semiconductor integrated circuit comprising:

a signal input terminal;

a signal output terminal;

a positive power supply terminal;

a first negative power supply terminal;

a second negative power supply terminal;

a first NPN bipolar transistor including a base connected to said signal input terminal;

a first resistive element connected between a collector of said first NPN bipolar transistor and said positive power supply terminal;

a PNP bipolar transistor including a collector connected to said collector of said first NPN bipolar transistor and an emitter connected to said positive power supply terminal;

a second NPN bipolar transistor including a base connected to said collector of said first NPN bipolar transistor, a collector connected to said positive power supply terminal, and an emitter connected to said signal output terminal;

a second resistive element connected between a base of said PNP bipolar transistor and said positive power supply terminal;

a third NPN bipolar transistor including a collector connected to said base of said PNP bipolar transistor and a base connected to said second negative power supply terminal;

a fourth NPN bipolar transistor including a base connected to an emitter of said third NPN bipolar transistor, a collector connected to said signal output terminal, and an emitter connected to said first negative power supply terminal;

a third resistive element connected between an emitter of said first NPN bipolar transistor and said first negative power supply terminal;

a fourth resistive element including a first end connected to said base of said fourth NPN bipolar transistor and said emitter of said third NPN bipolar transistor, and a second end connected to said second negative power supply terminal;

a first capacitive load element connected between said base of said PNP bipolar transistor and said emitter of said first NPN bipolar transistor; and a second capacitive load element connected between said emitter of said first NPN bipolar transistor and said base of said fourth NPN bipolar transistor.

4. An integrated circuit comprising:

a signal input terminal;

a signal output terminal;

a first bipolar transistor including a base connected to said signal input terminal and an emitter, said first bipolar transistor being coupled to said signal output terminal;

first and second power supply terminals;

a resistive element having a first end connected to a collector of said first bipolar transistor, and a second end connected to said first power supply terminal, said emitter of said first bipolar transistor coupled to said second power supply terminal;

a PNP bipolar transistor having a collector connected to a collector of said first bipolar transistor, an emitter connected to said first power supply terminal, and a base connected at a node where a signal phase is the same phase as a signal applied to the signal input terminal; and a capacitative load element connected between said base of said PNP bipolar transistor and said emitter of said first bipolar transistor.

5. A circuit according to claim 4, wherein said first bipolar transistor comprises a first NPN bipolar transistor, said first power supply terminal comprises a positive power supply terminal, and said resistive element comprises a first resistive element, said first resistive element is connected between said collector of said first NPN bipolar transistor and said positive power supply terminal and said emitter of said PNP bipolar transistor is connected to said positive power supply terminal.

6. A circuit according to claim 5, further comprising:

a second NPN bipolar transistor having a base connected to said collector of said first NPN bipolar transistor, a collector connected to said positive power supply terminal, and an emitter connected to said signal output terminal.

7. A circuit according to claim 6, further comprising:

said second resistive element connected between a base of said PNP bipolar transistor and said positive power supply terminal.

8. A circuit according to claim 7, wherein said second power supply terminal comprises a negative power supply terminal and another negative power supply terminal, said circuit further comprising:

a third NPN bipolar having a collector connected to said base of said PNP bipolar transistor, a base connected to said negative power terminal, and an emitter; and a fourth NPN bipolar transistor having a base connected to said emitter of said third NPN bipolar transistor, a collector connected to said signal output terminal and an emitter connected to said another negative power supply terminal.

9. A circuit according to claim 8, further comprising:

a third resistive element connected between said emitter of said first NPN bipolar transistor and said another negative power supply terminal.

10. A circuit according to claim 9, further comprising:

a fourth resistive element having a first end connected to said base of said fourth NPN bipolar transistor and said emitter of said third NPN bipolar transistor, and a second end connected to said another negative power supply terminal.

11. A circuit according to claim 8, further comprising:

a capacitative load element connected between said emitter of said first NPN bipolar transistor and said base of said fourth NPN bipolar transistor.

* * * * *